United States Patent
Chih

(10) Patent No.: US 7,600,165 B2
(45) Date of Patent: Oct. 6, 2009

(54) ERROR CONTROL CODING METHOD AND SYSTEM FOR NON-VOLATILE MEMORY

(75) Inventor: Yue Der Chih, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 213 days.

(21) Appl. No.: 10/075,938

(22) Filed: Feb. 13, 2002

(65) Prior Publication Data

US 2003/0154437 A1 Aug. 14, 2003

(51) Int. Cl.
*G11C 29/00* (2006.01)
*G06F 11/20* (2006.01)
(52) U.S. Cl. ...................... 714/711; 714/773
(58) Field of Classification Search ............. 714/711, 714/773
See application file for complete search history.

(56) References Cited

U.S. PATENT DOCUMENTS

| 5,430,859 A | * | 7/1995 | Norman et al. ............ 711/103 |
| 5,471,478 A | * | 11/1995 | Mangan et al. ............ 714/711 |
| 5,956,743 A | * | 9/1999 | Bruce et al. ............... 711/103 |
| 6,360,293 B1 | * | 3/2002 | Unno ........................ 711/103 |
| 6,460,145 B1 | * | 10/2002 | Sassa et al. ................... 714/5 |
| 6,580,638 B2 | * | 6/2003 | Conley et al. .......... 365/185.11 |

* cited by examiner

*Primary Examiner*—Stephen M Baker
(74) *Attorney, Agent, or Firm*—Thomas, Kayden, Horstemeyer & Risley

(57) ABSTRACT

Methods and systems for improving repairing efficiency in non-volatile memory. Repairing data may be read from an information array associated with the non-volatile memory. The repairing data is generally read to a volatile latch associated with the non-volatile memory. An error correction coding circuit (ECC) circuit can be enabled during reading of the repairing data for identifying and repairing defective columns or rows associated with the non-volatile memory, despite errors in the repairing data read out.

13 Claims, 4 Drawing Sheets

ERROR CONTROL CODING METHOD AND SYSTEM FOR NON-VOLATILE MEMORY

TECHNICAL FIELD

The present invention relates to non-volatile memory devices. The present invention also relates to methods and systems for improving the repairing efficiency of non-volatile memory devices. The present invention additionally relates to Error Correction Coding (ECC) methods and systems.

BACKGROUND OF THE INVENTION

Non-volatile memory design based on integrated circuit technology represents an expanding field. Non-volatile memory devices are generally configured as storage systems or devices that do not lose data when power is removed from the storage system or device. Several types of non-volatile memory devices are currently utilized in computers and other data-processing devices. The most commonly utilized non-volatile memory devices fall into three primary categories: EPROM, EEPROM and Flash memory.

The first type of commonly utilized non-volatile memory is Erasable Programmable Read-Only Memory (EPROM). EPROM is a type of non-volatile memory that can be reprogrammed after it is manufactured. EPROMS can generally be reprogrammed by removing the protective cover from the top of the EPROM computer chip and exposing the chip to ultraviolet light. EPROM is more than 20 years old and is popular for program storage because EPROM is inexpensive, is non-volatile, and allows code updates using an EPROM programmer system.

The second type of commonly utilized non-volatile memory device is the Electronically Erasable Programmable Read-Only Memory (EEPROM) class of memory devices. EEPROM devices are non-volatile memory devices that can be erased and programmed utilizing electrical signals. A typical EEPROM device includes several thousand-memory cells organized in an array. In general, a memory cell can includes a floating gate transistor and a select transistor.

This configuration is referred to as a two-transistor EEPROM cell. The select transistor in an EEPROM device is used to select memory cells that are to be erased or programmed. A selected memory cell refers to a memory cell that is either being programmed, erased, or read. On the other hand, unselected memory cells are the memory cells of the array that are not selected for programming, erasing, or reading. The floating gate transistors in the device are those transistors that store the digital data in each memory cell. The digital data can be stored as eight bit words called bytes. Each byte may be individually programmed and erased.

The third type of non-volatile memory that is generally used is Flash memory. Flash memory is another popular form of non-volatile memory utilized in computers and other electronic devices. The terminology "flash" comes from the ability to simultaneously electrically erase an entire memory array or a large portion of the memory array in a flash. Flash memory is similar to EEPROM memory in function but must be erased in blocks, whereas EPROM can be erased one byte at a time. Flash EPROM (erasable programmable read-only memory) devices, in particular, have developed into a popular source of non-volatile, electrically erasable memory in a wide range of digital applications. Flash memory devices typically use a one-transistor memory cell, which permits high memory densities, high reliability, and low power consumption. These characteristics have made flash memory very popular for low power applications, such as battery-backed or embedded memory circuits.

Common uses of non-volatile memory include portable computers, personal digital assistant (PDA) devices, digital cameras, and cellular telephones. In these devices, both program code and system data, such as configuration parameters and other firmware, are often stored in flash memory because of the compact storage and relative ease of software upgradeability. The use of flash memory, for example, to store upgradeable data has necessitated the development of mechanisms to protect the data from unintended erasure or reprogramming.

Memory arrays for use in non-volatile memory devices can be configured such that their memory cells are generally arranged in rows and columns. Typically, the gates of the transistors within the same row are connected to each other and to a common word line. Similarly, the drain electrodes of the transistors within the same column can be connected to each other and to a common bit line. In addition, the source electrodes of the transistors may be connected to each other via a common source line. To program a selected memory cell in a selected row and a selected column, a programming voltage can be applied to both the word line and the bit line which may be connected to the selected memory cell.

Memory arrays utilized to form EEPROM, EPROM, or Flash memory cells can use redundant memory elements (i.e., cells and accompanying word lines and bit lines organized as rows and columns) to compensate for production errors. Specifically, after the production of a complete memory array, a post-production test in the memory array can be generally performed. This post-production testing may indicate that a particular column, row or cell of the memory array is defective. A redundant memory element can then be substituted for the defective element. This substitution typically occurs after the entire memory array has been manufactured. By allowing a defective memory element to be replaced by a redundant element after production, the memory array can still be used.

Non-volatile memory can be utilized to store information necessary to repair defective rows and/or columns of memory arrays. The portion of the memory array that is utilized to store this repairing information can be referred to as the "information array." The repairing information is generally obtained to a volatile latch array after the associated computer system is powered-up. In order to save area or reduce associated circuit complexity, the information array can be placed together with the main array, such that both of these arrays share the same general "periphery circuit" and "bit lines." The repairing information, however, cannot be read-out correctly if the corresponding bit lines are defective. In other words, defective rows or columns cannot be repaired if a defective columns itself is relied upon to read-out the information array. Thus, the repairing efficiency in such configurations is quite low.

Based on the foregoing, the present inventor has come to the conclusion that a need exists for methods and systems, which would result in a dramatic increase in the repairing efficiency of rows and columns in non-volatile memory arrays. The present inventor, in particular, has concluded that the utilization of an Error Correction Coding (ECC) scheme can assist in improving this repairing efficiency.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

One aspect of the present invention provides methods and systems for repairing non-volatile memory.

Another aspect of the present invention provides methods and systems for improving row and column repairing in non-volatile memory.

Still another aspect of the present invention provides methods and systems for improving row and column repairing in non-volatile memory utilizing an error correcting coding (ECC) scheme.

Yet another aspect of the present invention provides methods and systems for improving row and column repairing efficiency in non-volatile memory utilizing a redundancy scheme.

The above and other aspects of the present invention are achieved as is now described. Methods and systems for improving repairing efficiency in non-volatile memory are disclosed herein. Row and/or column repairing data may be read from an information array associated with the non-volatile memory. The repairing data is generally read to a volatile latch array associated with the non-volatile memory. An error correction coding circuit (ECC) circuit can be enabled during reading of the repairing data for identifying and repairing defective rows or columns associated with the non-volatile memory, despite and error caused by a defective column. The ECC circuit can thus be enabled during an access of a main array associated with the non-volatile memory to thereby correct correctable errors if a particular address corresponds to an address of a defective row or column. This particular address may comprise, for example, a Y-address corresponding to a defective column. When accessing an information row, the ECC function described herein can be unconditionally enabled to ensure that repairing information can be correctly obtained. When accessing the main array, such an ECC function is generally enabled if the Y-address is coincident with a failed Y-address.

A read circuit is generally linked to the main array to thereby permit data to be read from the main array and transmitted to the ECC circuit. The ECC circuit is generally connected to the volatile latch array to thereby permit data to be transferred from the ECC circuit to the volatile latch array. The decoder circuit is generally linked to the volatile latch array and to the information array, at least one spare row, and the main array, wherein the main array can include a normal array and one or more spare columns. The main array may also be linked to the information array such that the information array is considered part of the main array or a separate array, which shares the same circuit periphery with the main array. The volatile latch array can be connected to the decoder circuit to thereby permit data contained within the volatile latch array to be accessed by the decoder circuit.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate embodiments of the present invention and are not intended to limit the scope of the invention.

Figure 1:
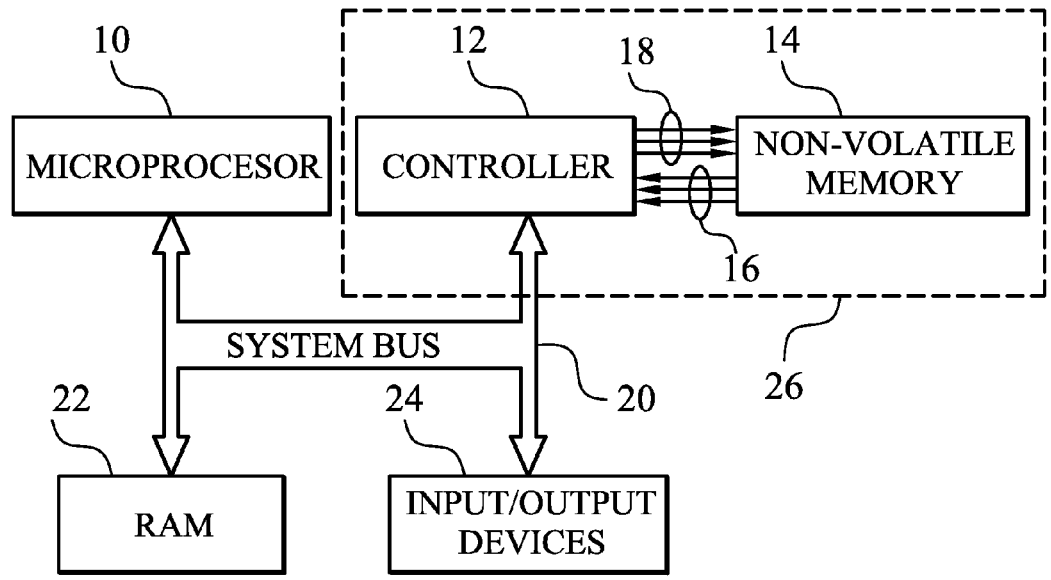
FIG. 1 illustrates a general microprocessor system in which a non-volatile memory device may be implemented in accordance with a preferred embodiment of present invention.
Figure 2:
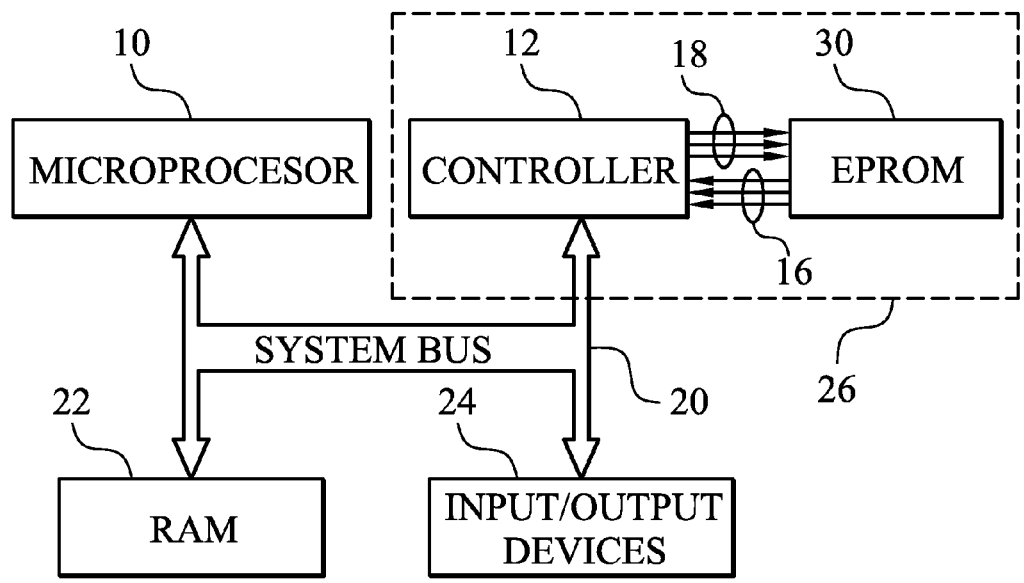
FIG. 2 depicts a general microprocessor system in which a non-volatile memory device, specifically an EPROM, may be implemented in accordance with a preferred embodiment of present invention.
Figure 3:
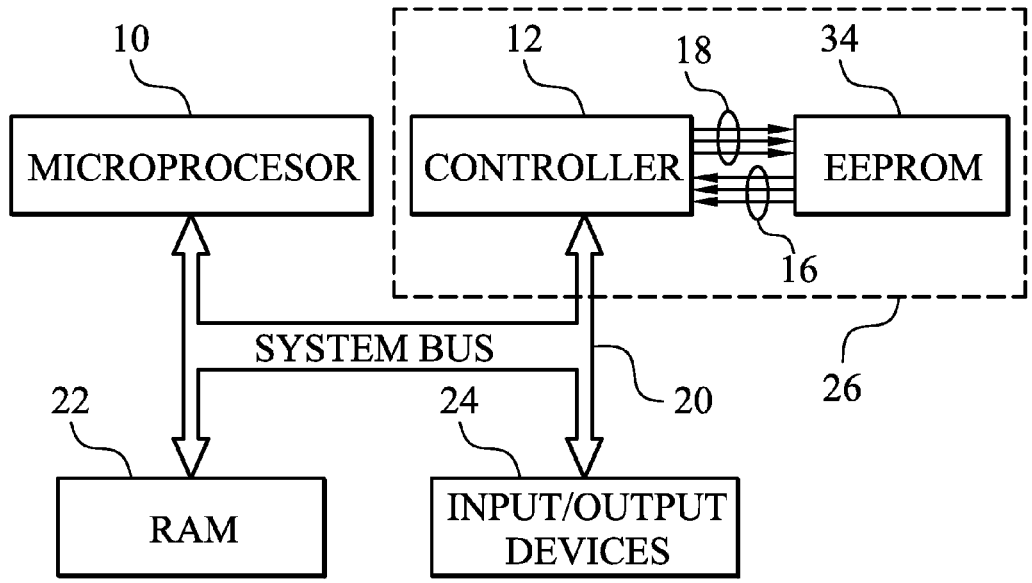
FIG. 3 illustrates a general microprocessor system in which a non-volatile memory device, specifically an EEPROM, may be implemented in accordance with a preferred embodiment of present invention.
Figure 4:
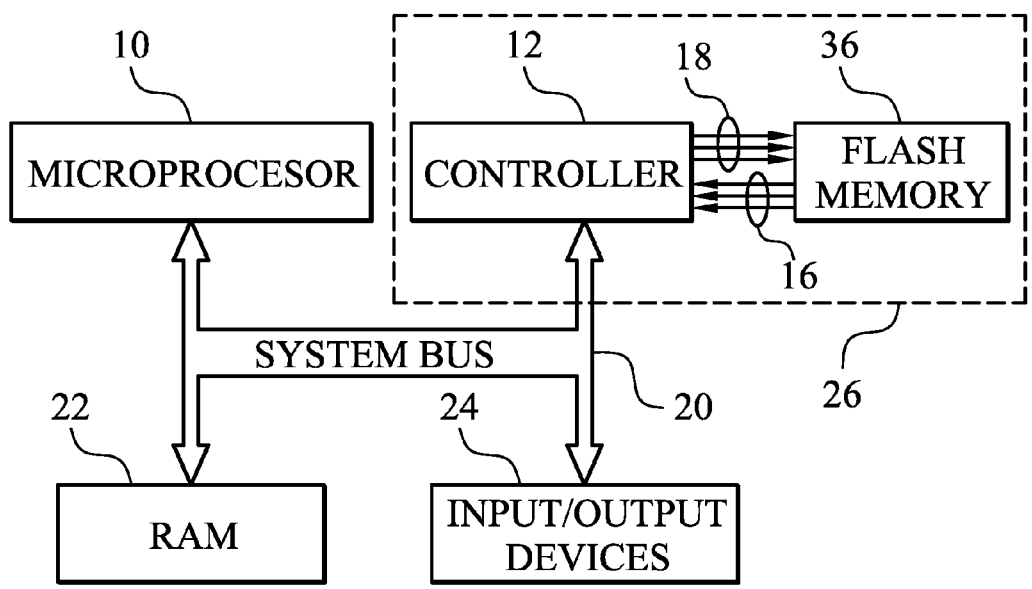
FIG. 4 depicts a general microprocessor system in which a non-volatile memory device, specifically a flash memory device, may be implemented in accordance with a preferred embodiment of present invention.

FIGS. 1 to 4 illustrate a general microprocessor system in which a non-volatile memory device may be implemented in accordance with a preferred embodiment of present invention. In FIGS. 1 to 4, analogous parts are indicated by identical reference numerals. Thus, a general non-volatile memory 14 is illustrated in FIG. 1, while other types of non-volatile memory devices are depicted in FIGS. 2 to 4. A computer system in which the various aspects of the present invention can be incorporated is thus illustrated generally in FIG. 1.

A typical computer system architecture includes a microprocessor 10 connected to a system bus 20, along with random access memory (RAM), main system memory 22, and at least one or more input-output devices 24, such as a keyboard, monitor, modem, and the like. Another main-computer system component that can be connected to a typical computer system bus 22 is a large amount of long-term, non-volatile memory 14. Typically, such a memory is a disk drive with a capacity of tens of megabytes of data storage. This data can be retrieved into the main system memory 22 (i.e., volatile memory) for use in current processing, and can be easily supplemented, changed or altered.

A memory controller 31 communicates with non-volatile memory 14 to form a bulk memory storage 26. Thus, bulk storage memory 26 can be constructed of a memory controller 12, connected to the computer system bus 20, and an array of non-volatile memory integrated circuit chips. Data and instructions can be communicated from memory controller 12 to such an array over a serial data line 18. Similarly, data and status signals may be communicated from non-volatile memory 14 to memory controller 12 over serial data lines 16. In one embodiment, each one of the serial data lines 16 and 18 is a multi-bit (e.g. 16-bit) serial bus having I/O terminals 8 for electrical coupling. Other control and status circuits between memory controller 12 and non-volatile memory 14 are not shown in FIG. 1. Those skilled in the art can appreciate that the system depicted in FIGS. 1 to 4 is presented for illustrative purposes only.

The bulk storage memory 26 of FIGS. 1 to 4 can be implemented on a single printed circuit card for moderate memory sizes. The system bus 20 may be terminated in connecting pins of such a printed circuit card for connection with the rest of the computer system through a connector (not shown in FIGS. 1 to 4). Also connected to the card and its components are various standard power supply voltages (not shown).

There are a variety of non-volatile memory devices that may be utilized to implement non-volatile memory 14. Thus, as illustrated in FIG. 2, an EPROM 30 may be utilized. An EPROM (Erasable Programmable Read-Only Memory) is generally a type of non-volatile memory chip that can be programmed after it is manufactured. As depicted in FIG. 3, an EEPROM 34 may be used as the non-volatile memory device. An Electrically Erasable and Programmable Read Only Memory ("EEPROM") is a non-volatile memory device that retains its memory even after power is shut down.

Finally, as depicted in FIG. 4, a Flash memory 36 may be utilized in accordance with the invention described and claimed herein. Flash memory is similar to EEPROM memory in function; however, it must be erased in blocks, whereas EEPROM can be erased one byte at a time. Because of its block-oriented nature, Flash memory is preferably utilized as a supplement to or replacement for hard disks in portable computers. Flash memory can either be constructed into the unit or available in the form of a PC card that can be plugged into a PCMCIA slot.

Note that for a large amount of memory, a single array forming non-volatile memory 14 may not be sufficient. In such a case, additional EEPROM arrays can be connected to the serial data lines 18 and 16 of memory controller 12 (i.e., a controller chip). Such an arrangement may preferably be implemented on a single printed circuit card; however if space is not sufficient to accomplish this, then one or more EEPROM arrays may be implemented on a second printed circuit card that is physically mounted onto the first and connected to a common controller chip.

Figure 5:
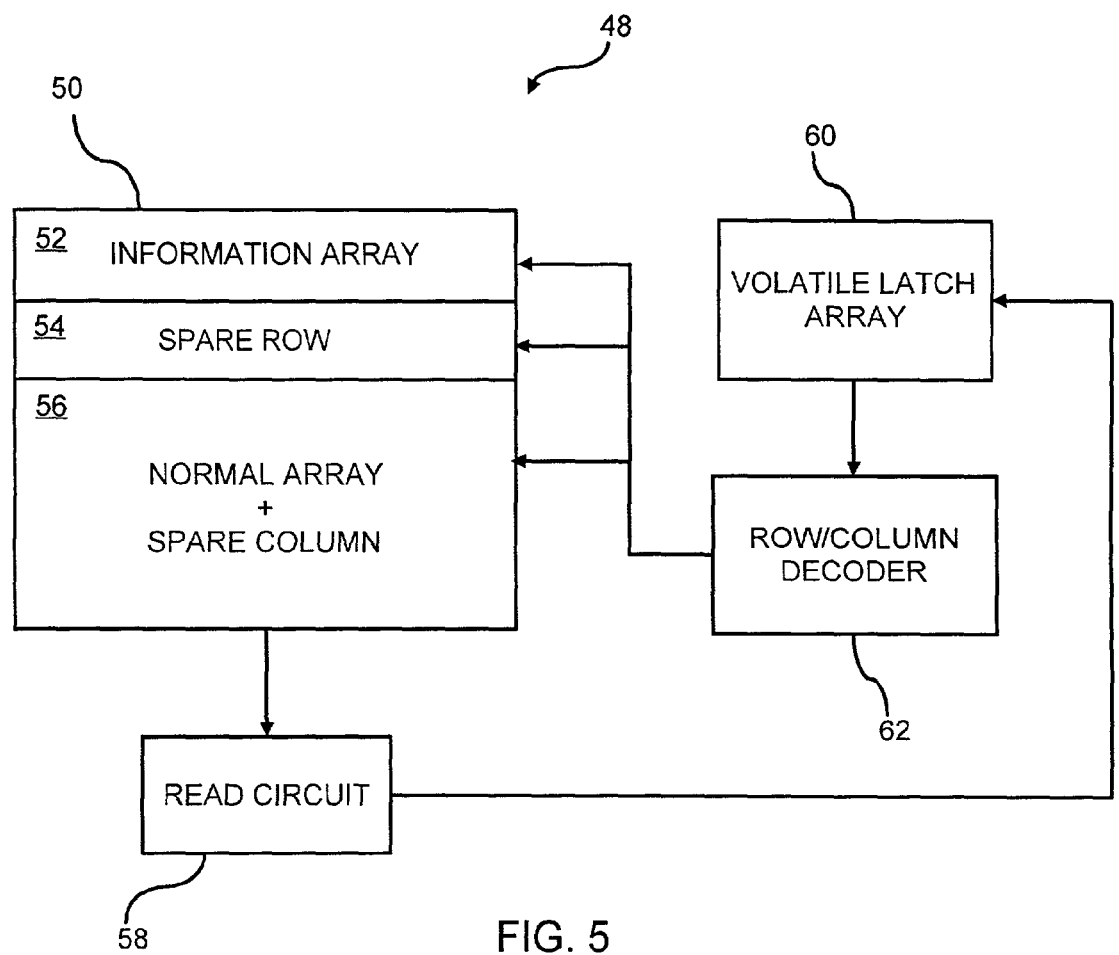
FIG. 5 illustrates a block diagram illustrative of a row and column repair scheme for non-volatile memory.

FIG. 5 illustrates a block diagram 48 illustrative of a row and column repair scheme for non-volatile memory. Non-volatile memory can be utilized to store information regarding correction of array rows and/or columns. A portion of non-volatile memory in which repair information is read out of memory is generally referred to as the "information array." Repairing information or data is thus read out of information array 52 to a volatile latch array 60 after the associated computer system is powered-up (i.e., initiated).

In order to save area or reduce the circuit complexity, information array 52 is generally placed with the main array 50. Main array 50 is composed of a spare row 54 and a section 56 comprising a "normal array" and a spare column. Thus, information array 52 and main array 50 share the same "periphery circuit" and "bit lines." The repairing information, however, cannot be read-out correctly if the corresponding bit lines are defective. In other words, defective columns may not be repaired if the defective column is utilized to read-out information array 52.

Note that in FIG. 5, main array 50 includes information array 52, spare row 54 and portion 56 (i.e. normal array and spare column). Those skilled in the art can appreciate, however, that in a varying embodiment of the present invention, information array 52 may be illustrated separate and apart from main array 50. The configuration depicted in FIG. 5 is thus presented for illustrative and educational purposes only and is not considered a limiting feature of the present invention.

Main memory 50 is generally connected to a read circuit 58 for reading data from main memory 50. Data from read circuit 58 can in turn be transmitted to volatile latch array 60. A decoder circuit 62 (i.e., row/column decoder) is generally linked to information array 52, spare row 54, and portion 56 of main memory 50.

Figure 6:
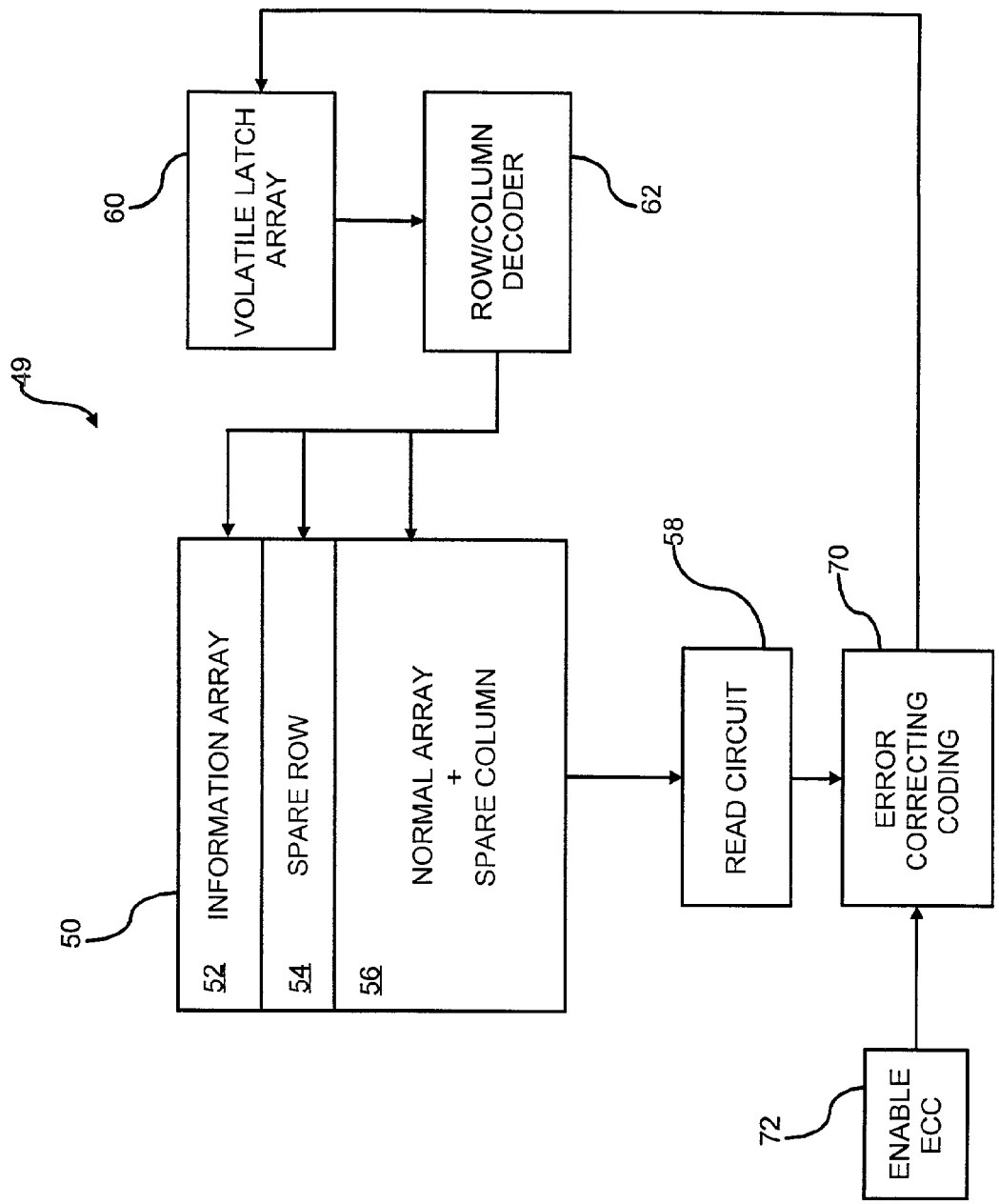
FIG. 6 depicts a block diagram illustrative of a row and column repair scheme for non-volatile memory utilizing an error correction coding (ECC) circuit, in accordance with a preferred embodiment of the present invention.

FIG. 6 depicts a block diagram 49 illustrative of a row and column repair scheme for non-volatile memory utilizing an error correction coding (ECC) circuit, in accordance with a preferred embodiment of the present invention. Note that in FIGS. 5 and 6, analogous or similar parts are indicated by identical reference numerals. The configuration depicted in block diagram 49 thus depicts a redundancy scheme involving the use of Error correction coding (ECC) to improve the efficiency of row and column repairing. Error correction codes are generally utilized to correct certain classes of errors in memory storage devices, such as non-volatile memory devices, to greatly reduce the probability of an error affecting the memory output. ECC is generally an encoding method that permits the detection and correction of errors that can occur during data storage and transmission.

An error correction coding (ECC) circuit 70 is linked to volatile latch array 60, which in turn is connected to decoder circuit 62. ECC circuit 70 can be enabled through ECC enabling circuit 72, which is connected to ECC circuit 70. Read circuit 58 can access main memory 50 and transfer data to ECC circuit 70. To achieve improved row and column repair, information may be read from information array 52 to volatile latch array 60 after system power-up. During access of main array 50, ECC circuit 70 is enabled to correct correctable errors if a Y-address corresponds to an address indicative of a defective row and/or column. During the obtained of repairing information from information array 52, ECC circuit 70 is always enabled to correct any correctable errors of data. The correct repairing information can be read out of information array 52 even if some of the selected columns are defective during access of information array 52.

The configuration illustrated in FIG. 6 enables ECC circuit 70 to correct the correctable error when accessing repairing formation from information array 52. The repairing information can be obtained correctly even if a corrupted bit is present. This configuration thus improves the repairing efficiency when the information array 52 shares the same read/write circuit and bit lines with main array 50. If an ECC circuit, such as ECC circuit 70, is not available, corrupted bits in information array 52 will render the chip unrepairable.

FIG. 6 thus depicts a configuration that may be utilized to improve column and/or row repairing efficiency in non-volatile memory devices, such as, for example, EPROM, EEPROM and Flash memory devices. Column and/or row repairing data may be read from information array 52, which is associated with the non-volatile memory and can form part of main array 50. This repairing data is generally read to volatile latches (e.g., volatile latch array 60) associated with the nonvolatile memory. ECC circuit 70 can be enabled during reading of the repairing data for identifying and repairing defective rows and/or columns associated with the non-volatile memory, despite an error in the repairing information caused by a defective column. ECC circuit 70 can thus be enabled during an access of main array 50 (i.e., which is associated with the non-volatile memory) to thereby correct a correctable error if a particular address corresponds to an address of at least one defective row and/or column. This particular address may, for example, comprise a Y-address corresponding to a defective column.

Read circuit 58 is generally linked to main array 50 to thereby permit data to be read from main array 50 and transmitted to ECC circuit 70. ECC circuit 70 is generally connected to volatile latch array 60 to thereby permit data to be transferred from ECC circuit 70 to volatile latch array 60. Decoder circuit 62 is generally linked to ECC circuit 70. Decoder circuit 62 is also generally linked to information array 52, spare row 54, and main array 50. Main array 50 can be configured to include a normal array and one or more spare columns.

The number of spare columns determines the maximum number of defective columns on a normal array that can be repaired. In one embodiment, 512 columns are in the array, the data bus is 16 bits, and a (16,11) Hamming code is used. A total of 20 spare columns are provided, each spare being assignable to one of four sets of four I/O terminals and five spares being reserved for each such set of four I/O terminals.

Traditionally, each spare column is reserved for repairing one column corresponding to a specific I/O terminal. If there are 16 I/O terminals for a 16-bit data bus, then 16 spare columns would normally be required to support a one-time repair of any possible column out of the 16 columns accessed at one time. To improve repairing efficiency, the columns for two or more I/O terminals can be made to share a single spare column in a more complicated design. In the specific embodiment described above, all columns associated with a set of four I/O terminals share a single set of five spare columns. The (16,11) Hamming code is well known in the are and is described as pg. 64 of "Error control Coding; Fundamentals and Applications," by Shu Lin & Daniel J. Costello, Jr.).

Main array 50 may also be linked to information array 52, such that information array 52 is considered part of main array 50 or a separate array, which shares the same circuit periphery with main array 50. Volatile latch array 60 can be connected to decoder circuit 62 to thereby permit data contained within volatile latch array 60 to be accessed by decoder circuit 62. Note that when accessing an information row, the ECC function is unconditionally enabled to make certain that repairing information will be correctly read-out. When accessing main array 50, the ECC function is generally enabled if the Y-address is coincident with a failed Y-address.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered.

The description as set forth is not intended to be exhaustive or to limit the scope of the invention. Many modifications and variations are possible in light of the above teaching without departing from scope of the following claims. It is contemplated that the use of the present invention can involve components having different characteristics. It is intended that the scope of the present invention be defined by the claims appended hereto, giving full cognizance to equivalents in all respects.

What is claimed is:

1. A method for improving repairing efficiency in a non-volatile memory, said method comprising the steps of:
   reading repairing data from an information array associated with said non-volatile memory to a volatile latch array associated with said non-volatile memory, said information array sharing a read circuit with a main memory array comprising said non-volatile memory;
   enabling an error correction coding circuit separate from said information array during reading of said repairing data including corrupted repairing data located anywhere in said information array, said repairing data for identifying and repairing defective columns or rows comprising said main memory array despite corruption of the repairing data as read;
   providing a plurality of columns and rows associated with said non-volatile memory;
   associating each of said plurality of columns associated with said non-volatile memory with a respective I/O terminal; and
   using a (16,11) Hamming code to associate at least one spare column with at least two of each of said plurality of columns associated with both said non-volatile memory and with a respective I/O terminal.

2. The method of claim 1 further where in the step of reading repairing data from an information array associated with said non-volatile memory to a volatile latch array associated with said non-volatile memory further comprises the steps of:
   accessing said repairing data contained within said information array following initialization of a computer system associated with said non-volatile memory; and
   thereafter transferring said repairing data to said volatile latch array.

3. The method of claim 1 further comprising the step of:
   enabling the error correction coding circuit unconditionally when accessing an information row within said information array to make certain that said repairing data will be correctly obtained.

4. The method of claim 1 further comprising the step of:
   enabling said error correction coding circuit during an access of said main memory array comprising said non-volatile memory for correcting a correctable error if a particular address corresponds to an address of at least one defective column comprising said main memory array.

5. The method of claim 4 wherein said particular address comprises a Y-address corresponding to said at least one defective column.

6. The method of claim 1 further comprising the step of:
   using a read circuit linked to said main memory array to read data from said main memory array and to transmit the read data to said error correction coding circuit;
   said error control circuit being connected to said volatile latch array to permit data to be transferred from said error correction coding circuit to said volatile latch array;
   said error correction coding circuit being linked a decoder circuit and thereby to said information array, at least one spare row and said main memory array, and wherein said main memory array includes a normal array and at least one spare column.

7. The method of claim 6 wherein said volatile latch array is linked to said decoder circuit to thereby permit data contained within said volatile latch array to be accessed by said decoder circuit.

8. A system for improving repairing efficiency in a non-volatile memory, said system comprising:
   a reading circuit for reading repairing data from an information array associated with said non-volatile memory to a volatile latch array associated with said non-volatile memory, said information array sharing said read circuit with a main memory array comprising said non-volatile memory;
   an error correction coding circuit separate from said information array adapted to be enabled during reading of said repairing data including reading corrupted repairing data located anywhere in said information array, said repairing data for identifying and repairing defective columns or rows comprising said main memory array despite corruption of the repairing data as read;

a plurality of columns and rows each associated with said non-volatile memory, wherein each of said plurality of associated columns and rows is further associated with a respective I/O terminal; and a spare column, wherein said error correction coding circuit using a (16,11) Hamming code to associate said spare column with at least two of each of said plurality of columns associated with both said non-volatile memory and with a respective I/O terminal.

9. The system of claim 8 wherein:

said repairing data contained within said information array is accessed following initialization of a computer system associated with said volatile latch array, thereby resulting in the transfer of said repairing data to said volatile latch array.

10. The system of claim 8 wherein:

said error correction coding circuit is adapted to be enabled during an access of said main memory array comprising said non-volatile memory for correcting a correctable error if a particular address corresponds to an address of at least one defective column.

11. The system of claim 10 wherein said particular address comprises a Y-address corresponding to said at least one defective column.

12. The system of claim 8 further wherein said read circuit is linked to said main memory array to thereby permit data to be read from said main memory array and to be transmitted to said error correction coding circuit;

said error control circuit is connected to said volatile latch array to thereby permit data to be transferred from said error correction coding circuit to said volatile latch array; and said error correction coding circuit is linked to a decoder circuit, and thereby to said information array, at least one spare row, and said main memory array, said main memory array includes a normal array and at least one spare column.

13. The system of claim 12 further wherein said volatile latch array is linked to said decoder circuit to thereby permit data contained within said volatile latch array to be accessed by said decoder circuit.

* * * * *